United States Patent
Ohashi (10) Patent No.: US 10,742,204 B2
(45) Date of Patent: Aug. 11, 2020

(54) SEMICONDUCTOR DEVICE AND POWER MODULE

(71) Applicant: FUJI ELECTRIC CO., LTD., Kanagawa (JP)

(72) Inventor: Hidetomo Ohashi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/174,252

(22) Filed: Oct. 29, 2018

(65) Prior Publication Data

US 2019/0190514 A1  Jun. 20, 2019

(30) Foreign Application Priority Data

Dec. 18, 2017 (JP) ................... 2017-242035

(51) Int. Cl.
*H03K 17/082* (2006.01)
*H03K 17/0812* (2006.01)

(52) U.S. Cl.
CPC ... *H03K 17/08128* (2013.01); *H03K 17/0828* (2013.01)

(58) Field of Classification Search
CPC ....... H01L 2924/00; H01L 2924/00014; H01L 2224/49111; H01L 2224/48247; H03K 17/082; H03K 17/0828; H03K 17/18; H03K 17/0822
See application file for complete search history.

(56) References Cited

U.S. PATENT DOCUMENTS

| | | | | |
|---|---|---|---|---|
| 9,967,946 B1* | 5/2018 | Tiwari | ................ | H05B 33/089 |
| 2017/0041994 A1* | 2/2017 | Katsura | ............. | H05B 33/0815 |
| 2018/0092175 A1* | 3/2018 | Mao | ................... | H05B 33/0809 |

FOREIGN PATENT DOCUMENTS

| | | |
|---|---|---|
| JP | 5817710 B2 | 11/2015 |
| WO | 0163765 A1 | 8/2001 |

\* cited by examiner

*Primary Examiner* — Sibin Chen (57) ABSTRACT

A device including: a transistor having a collector-emitter junction connected in series or parallel to a current detection resistance for detecting current that flows through a current sensing terminal of a switching element; and an overshoot processing circuit connected between the current sensing terminal and a base of the transistor, which reduces overshoot of sense current flowing through the current detection resistance, the overshoot is caused by switching operation of the switching element, by controlling the transistor depending on current input from the current sensing terminal, is provided.

10 Claims, 7 Drawing Sheets

SEMICONDUCTOR DEVICE AND POWER MODULE

The contents of the following Japanese patent application are incorporated herein by reference:

NO. 2017-242035 filed in JP on Dec. 18, 2017.

BACKGROUND

1. Technical Field

The present invention relates to a semiconductor device and a power module.

2. Related Art

An insulated gate type bipolar transistor (IGBT) has a sense-emitter through which sense emitter current flows, and a technique for detecting overcurrent by converting the sense emitter current into voltage is conventionally known (refer to Patent Document 1, for example). In Patent Document 1, erroneous detection of overcurrent that results from sense emitter current jumping up at the time of turn-on and turn-off of an IGBT is prevented by connecting a resistance for converting the sense emitter current into sense voltage, and a series body of a condenser and a resistance in parallel.

Patent Document 1: International Publication WO 01/63765.

For the purpose of protecting a switching element of an IGBT or the like more appropriately, it is desired to prevent erroneous detection of overcurrent that results from transient current to occur at the time of turn-on and turn-off, and/or to make it possible to detect overcurrent in a short amount of time.

SUMMARY

A semiconductor device is provided in the first aspect of the present invention. The semiconductor device may include a transistor having: a collector connected to one end side of a current detection resistance that is connected to a current sensing terminal side of a switching element; and an emitter connected to the other end side of the current detection resistance. Also, the semiconductor device may include an overshoot processing circuit connected between the current sensing terminal and a base of the transistor by controlling the transistor depending on current input from the current sensing terminal, the overshoot processing circuit reduces overshoot of sense current flowing through the current detection resistance, which is caused by switching operation of the switching element.

The overshoot processing circuit may have the capacitor connected between the current sensing terminal and a base of the transistor. Also, the first overshoot processing circuit may have the first resistor connected between the current sensing terminal and the collector of the transistor.

The overshoot processing circuit may have the second resistor connected between the base and the emitter of the transistor.

The overshoot processing circuit may have the time constant corresponding to at least one of turn-on time and turn-off time of a switching element.

The semiconductor device may include overcurrent determining circuit to determine overcurrent based on voltage to occur at the current detection resistance.

The semiconductor device may include an integrator circuit connected between the collector of the transistor and the overcurrent determining circuit. The integrator circuit may have the time constant smaller than that of the overshoot processing circuit.

A semiconductor device is provided in the second aspect of the present invention. The semiconductor device may include a transistor having: a collector connected to a current sensing terminal side of a switching element; and an emitter connected to a current detecting resistance side of the switching element. The semiconductor device may include an overshoot processing circuit connected between the current sensing terminal of the switching element and a base of the transistor. By controlling the transistor depending on current input from the current sensing terminal, the overshoot processing circuit reduces overshoot of sense current flowing through the current detection resistance, which is caused by switching operation of the switching element.

The overshoot processing circuit may have the third resistor connected between the collector and the base of the transistor. The overshoot processing circuit may have the second capacitor connected between the base and the emitter of the transistor.

The overshoot processing circuit may have the time constant corresponding to at least one of turn-on time and turn-off time of the switching element.

The semiconductor device may include an overcurrent determining circuit to determine overcurrent based on voltage to occur at the current detection resistance.

The semiconductor device may include an integrator circuit connected between the collector of the transistor and the overcurrent determining circuit.

The integrator circuit may have the time constant smaller than that of the overshoot processing circuit.

The semiconductor device may further have a driving circuit to drive the switching element.

A power module is provided in the third aspect of the present invention. The power module may include the semiconductor device described above. The power module may include a switching element.

The power module may further include a current detection resistance.

Note that, the summary clause described above does not necessarily describe all necessary features of the embodiments of the present invention. The present invention may also be a sub-combination of the features described above.

DESCRIPTION OF EXEMPLARY EMBODIMENTS

Hereinafter, the present invention will be described with reference to embodiments of the invention. However, the following embodiments should not to be considered as limiting the claimed invention. Also, every combination of features described with reference to the embodiments should not to be considered essential to means provided by aspects of the invention.

Figure 1:
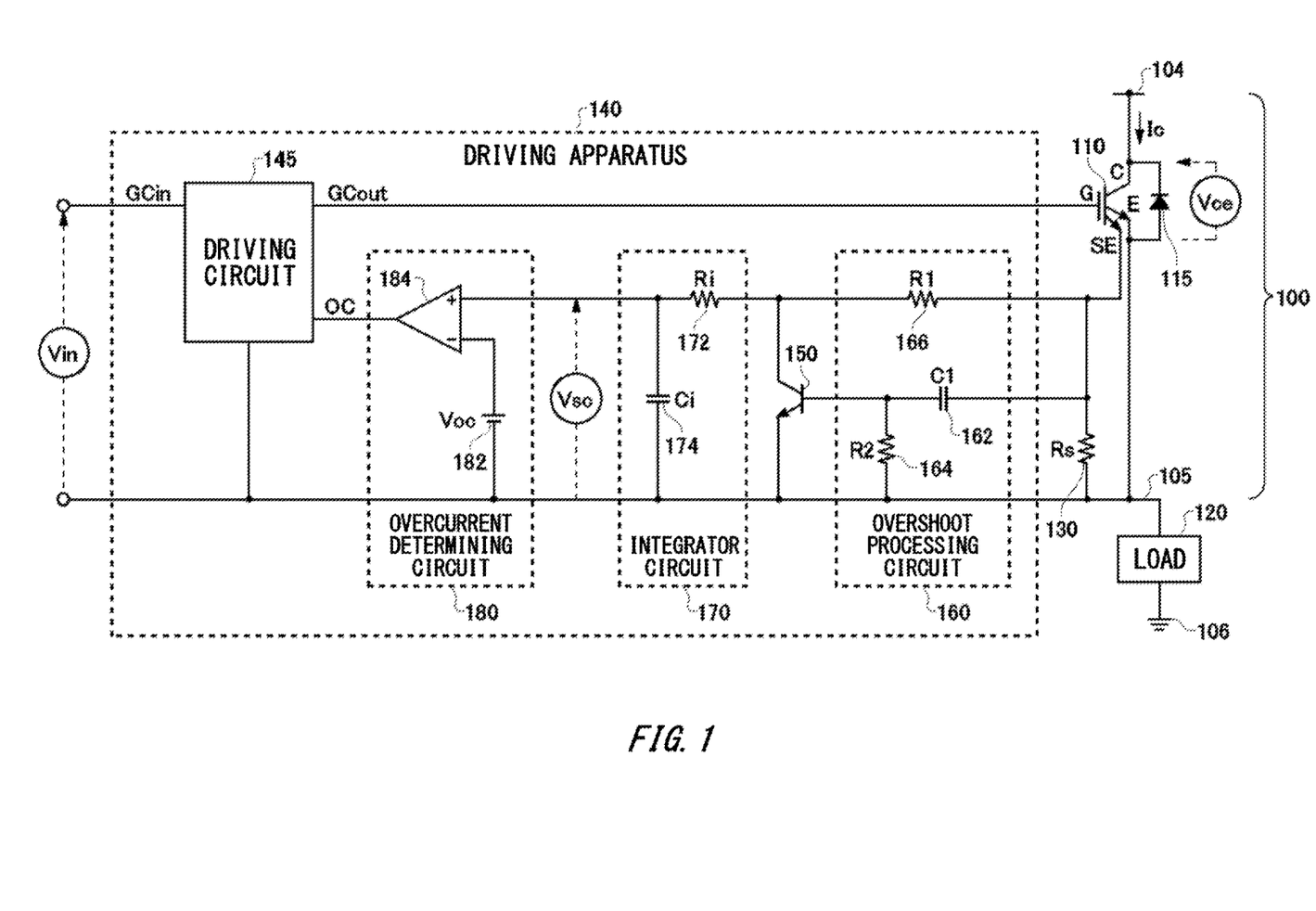
FIG. 1 illustrates a semiconductor device 100 according to the present embodiment together with a load 120.

FIG. 1 illustrates a semiconductor device 100 according to the present embodiment together with a load 120. The semiconductor device 100 is connected to the load 120 and switches between on/off of current supplied to the load 120. In an example, the semiconductor device 100 is a power module such as an intelligent power module used for driving a load 120 of a motor or the like or supplying power to any one of various loads 120 that consumes power. In the present diagram, the semiconductor device 100 is connected to the high side (the high voltage side) of the load 120. However, instead of this, the semiconductor device 100 may have a configuration in which it is connected to the low side (the low voltage side) of the load 120. Also, the semiconductor device 100 may be an inverter device. In this case, the arm on the high side (the upper arm) of the inverter device is illustrated, and the arm on the low side (the lower arm) is omitted from the present diagram.

The semiconductor device 100 includes a switching element 110 and switches between on/off of current supplied to the load 120 by the switching element 110. The switching element 110 may be a voltage-driven switching element, for example, an IGBT. Instead of this, the switching element 110 may be a MOSFET such as a power MOSFET of a wide gap semiconductor such as SiC, GaN, diamond, gallium nitride-based material, gallium oxide-based material, AlN, AlGaN, ZnO, or the like, for example. The switching element 110 has a collector-emitter junction connected in series to the load 120 between a power supply potential 104 and a ground potential 106, and connects or disconnects between the load 120 and the power supply potential 104 depending on gate voltage input to a gate thereof. The switching element 110 has a current sensing terminal such as a sense-emitter terminal SE, and outputs sense current for detecting current, which changes corresponding to the main current flowing through the collector-emitter junction.

In an example, the switching element 110 has a configuration in which it includes a main cell through which the main current flows and a current sense cell through which the sense current flows. The main cell is connected to the collector-emitter junction, the current sense cell is connected between the collector and the sense-emitter, and the gate of the switching element 110 is connected to gates of both of the main cell and the current sense cell. The current sense cell is set to have the area ratio such as less than 1/1000 relative to the main cell. Thereby, in a steady state of the current sense cell, the sense current flows through at ratio corresponding to the area ratio relative to the main current (1/1000, for example). However, difference can occur between the main cell and the current sense cell in their wire resistance of the gate wiring from a gate terminal of the switching element 110, gate capacitance, threshold voltage, inductance of circuits to which they are connected, or the like. Thus, in a transient state at the time of turn-on and turn-off of the switching element 110, difference occurs to their operation timing, and the current shunt ratio of the main current and the sense current can significantly fluctuate. If existence of overcurrent in the switching element 110 is determined using such sense current, the sense current transiently overshoots and thus overcurrent may be erroneously detected. Therefore, the semiconductor device 100 has a function of reducing overshoot of the sense current caused by switching of the switching element 110.

The semiconductor device 100 further includes a diode 115, a current detection resistance 130, and a driving apparatus 140. The diode 115 is a FWD (Free Wheel Diode) having a cathode-anode junction connected in parallel to the collector-emitter junction of the switching element 110, and used for commutating load current from the load 120. The load 120 may be composed of a wide gap semiconductor, or if the switching element 110 is a MOSFET, it may be realized by a parasitic diode.

The current detection resistance 130 is a resistance connected between the current sensing terminal of the switching element 110 and the reference potential 105, and used for detecting current flowing through the current sensing terminal of the switching element 110. The current detection resistance 130 converts the sense current from the current sensing terminal into voltage (sense voltage). The current detection resistance 130 according to the present embodiment has a resistance value Rs, and if a sense current Is flows therethrough, it generates a voltage of Is×Rs.

The driving apparatus 140 drives the switching element 110 by supplying the gate of the switching element 110 with gate voltage that corresponds to a gate control input signal GCin externally input, and controls on/off of the switching element 110. Also, the driving apparatus 140 determines whether or not overcurrent is flowing through the switching element 110 based on the sense voltage generated by the current detection resistance 130. If overcurrent is flowing through the switching element 110, the driving apparatus 140 protects the switching element 110. A circuit of the driving apparatus 140 may be partially or entirely integrated as an IC or a LSI.

The driving apparatus 140 has a driving circuit 145, a transistor 150, an overshoot processing circuit 160, an integrator circuit 170, and an overcurrent determining circuit 180. The driving circuit 145 inputs the gate control input signal GCin, and a gate control output signal GCout having gate voltage corresponding to the gate control input signal GCin is output to the gate of the switching element 110. Having the reference potential 105 as a reference, the gate control input signal GCin has a voltage Vin. As an example, if the voltage Vin has a high logic level, the driving circuit 145 outputs the gate control output signal GCout having a voltage level to turn on the switching element 110. If the voltage Vin has a low logic level, the driving circuit 145 outputs the gate control output signal GCout having a voltage level to turn off the switching element 110. Also, the driving circuit 145 inputs an overcurrent signal OC to indicate whether or not overcurrent is flowing through the switching element 110. Provided that the overcurrent signal OC indicates overcurrent, the driving circuit 145 protects the switching element 110 by controlling the gate control output signal GCout so as to turn off the switching element 110 regardless of the value of the gate control input signal GCin.

The transistor 150 has a collector-emitter junction connected in parallel to the current detection resistance 130. In the present diagram, the transistor 150 has: a collector connected to one end side of the current detection resistance 130 that is directly or indirectly connected to the current sensing terminal side of the switching element; and an emitter directly or indirectly connected to the other end side of the current detection resistance 130. The transistor 150 may be an NPN transistor having a collector directly or indirectly connected to the current sensing terminal of the switching element 110, and having an emitter directly or indirectly connected to the reference potential 105 that serves as a reference of the switching element 110. Instead of this, the transistor 150 may be another type of transistor, a FET or the like.

The overshoot processing circuit 160 is connected between a current sensing terminal of the switching element 110 and a base (or a gate) of the transistor 150. By controlling the transistor 150 depending on current input from the current sensing terminal, the overshoot processing circuit 160 reduces overshoot of sense current flowing through the current detection resistance 130, which is caused by switching operation of the switching element 110. The overshoot processing circuit 160 according to the present embodiment has a capacitor 162 connected between the current sensing terminal and the base of the transistor 150. The capacitor 162 is an example of the first capacitor, and functioning as a filter to block a low frequency component in the fluctuation of the sense current while propagating a high frequency component to the transistor 150 in the fluctuation of the sense current and converts the high frequency component into base current of the switching element 110. Accordingly, if sense current is drastically increased due to the switching of the switching element 110, the capacitor 162 propagates this transient increase of the sense current to the transistor 150. Thereby, the transistor 150 increases current to flow through the collector-emitter junction in response to the increase in the base current, and entirely or at least partially makes the drastically increased sense current flow to the reference potential 105 without intervention of the current detection resistance 130. As a result, the overshoot processing circuit 160 can reduce overshoot of the sense current to flow through the current detection resistance 130 and the sense voltage to occur at the current detection resistance 130.

The overshoot processing circuit 160 may further has a resistance 164 connected between the base and the emitter of the transistor 150. The resistance 164 is an example of the second resistor, and connected between the base and the reference potential 105. Together with the capacitor 162, the resistance 164 constitutes a differential circuit. The time constant of the differential circuit can be settable and adjustable by adjusting a capacitance value C1 of the capacitor 162 and a resistance value R2 of the resistance 164. Also, in a steady state between turn-on and turn-off of the switching element 110, the resistance 164 keeps the base of the transistor 150 at the potential equal to the reference potential 105, and keeps a disconnection state of the transistor 150.

The overshoot processing circuit 160 may further have a resistance 166 connected between the current sensing terminal and the collector of the transistor 150. The resistance 166 is an example of the first resistor. By providing the resistance 166, in a case in which at least a part of sense current flows through the transistor 150 in the transient state, it is possible to supply the overcurrent determining circuit 180 with voltage obtained by dividing resistance between operation resistance of the resistance 166 and the transistor 150.

Here, the overshoot processing circuit 160 may have the time constant corresponding to at least one of turn-on time and turn-off time of the switching element 110. That is, for example, in a circuit between the current sensing terminal of the switching element 110 and the base of the transistor 150, the overshoot processing circuit 160 may have the time constant that is determined depending on turn-on time and/or turn-off time of the switching element 110. As an example, the overshoot processing circuit 160 may have the time constant substantially equal to at least one of turn-on time and turn-off time of the switching element 110. Thereby, in a configuration in which the switching element 110 is applied to the semiconductor device 100, if the transient period in turn-on and/or turn-off of the switching element 110 is long, the time constant of the overshoot processing circuit 160 is made large accordingly. Also, if the transient period is short, the time constant of the overshoot processing circuit 160 is made small accordingly. As a result, the overshoot processing circuit 160 allows the period of time in reducing the overshoot to be a short period of time while appropriately reducing the overshoot of the sense current of the switching element 110 in the transient state.

The integrator circuit 170 is connected between the collector of the transistor 150 and the overcurrent determining circuit 180, and suppresses minor fluctuations of the sense voltage generated by the current detection resistance 130. The integrator circuit 170 includes a resistance 172 connected in series between the collector of the transistor 150 and the overcurrent determining circuit 180, and a capacitor 174 connected between the wire between the resistance 172 and the overcurrent determining circuit 180 and the reference potential 105. The integrator circuit 170 has the time constant smaller than that of the overshoot processing circuit 160 in order to suppress the minor fluctuations of the sense voltage generated by the current detection resistance 130. The integrator circuit 170 is not for the purpose of dulling and restraining overshoot of the sense voltage by smoothing the sense voltage in the entire period of turn-on time and turn-off time of the switching element 110. Note that, the semiconductor device 100 may have a configuration free of the integrator circuit 170.

The overcurrent determining circuit 180 is connected to a terminal of the current detection resistance 130 on the switching element 110 side via the overshoot processing circuit 160 and the integrator circuit 170, and determines overcurrent based on the sense voltage occurring at the current detection resistance 130. The overcurrent determining circuit 180 includes a reference voltage source 182 and a comparator 184. Having the reference potential 105 as a reference, the reference voltage source 182 generates a reference voltage Voc that corresponds to the overcurrent level of the switching element 110. A sense voltage Vsc is a sense voltage of the current detection resistance 130, which is received via the overshoot processing circuit 160 and the integrator circuit 170. The comparator 184 compares the sense voltage Vsc to the reference voltage Voc and outputs an overcurrent signal OC depending on the comparison result. In the present embodiment, if the sense voltage Vsc exceeds the reference voltage Voc, the comparator 184 outputs the overcurrent signal OC of a high logic level and if the sense voltage Vsc is equal to the reference voltage Voc or lower, it outputs an overcurrent signal OC of a low logic level.

According to the semiconductor device 100 described above, overshoot of the sense voltage to occur at the current detection resistance 130 can be reduced by controlling the base of the transistor 150 depending on the input from the current sensing terminal, and making at least a part of the sense current in a transient state during switching of the switching element 110 flow to the reference potential 105 via the transistor 150 without intervention of the current detection resistance 130. It can be construed that this operation is for the transistor 150 and the overshoot processing circuit 160 clamping the sense voltage that occurs at the current detection resistance 130 in a transient state.

Figure 2:
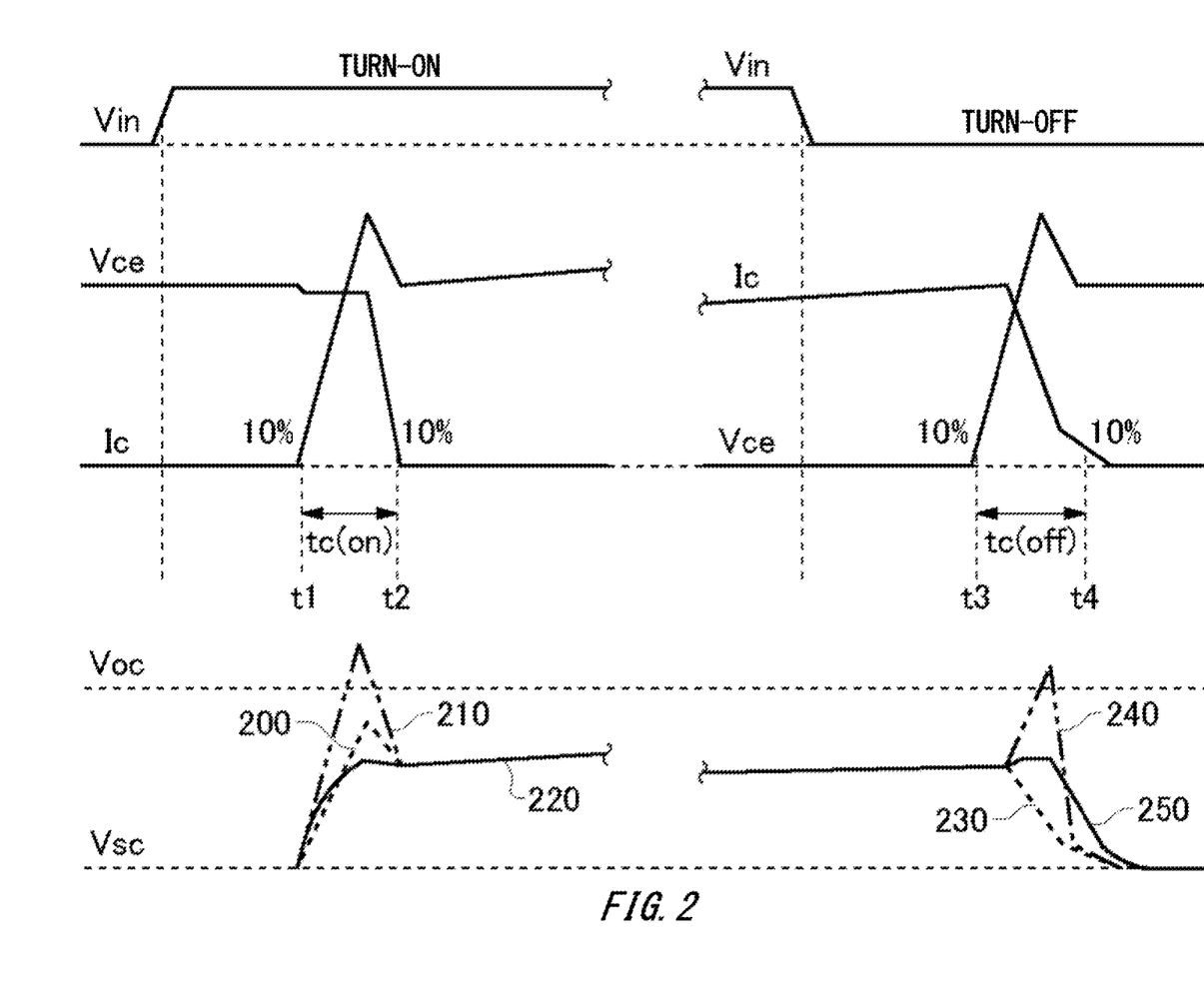
FIG. 2 illustrates examples of operation waveforms of the semiconductor device 100 according to the present embodiment.

FIG. 2 illustrates examples of operation waveforms of the semiconductor device 100 according to the present embodiment. The present diagram illustrates the passage of time in the horizontal axis, and illustrates a waveform of an input voltage Vin input to the gate control input signal GCin, waveforms of a voltage Vce applied to the switching element 110 and a collector current Ic of the switching element 110, and a waveform of a sense voltage Vsc input to the overcurrent determining circuit 180 in the vertical axis.

In turn-on operation of the switching element 110, if the input voltage Vin rises, a gate control output signal GCout rises after the delay caused by the driving circuit 145 or the like, then the collector current Ic starts to increase and becomes 10% of the rated value at time t1. If gate voltage of the switching element 110 is increased and exceeds the threshold voltage, the voltage Vce in the collector-emitter junction of the switching element 110 is rapidly decreased and becomes 10% of the rated value at time t2. The period of time from when the collector current Ic becomes 10% of the rated value at the time of turn-on of the switching element 110 to when the voltage Vce applied to the switching element 110 becomes equal to 10% or less of the rated value is defined as tc(on) (Vce-Ic Cross time of turn-on). The tc(on) can change depending on the ability of the switching element 110, the gate driving ability of the driving circuit 145, the recovery time period of the diode connected parallel to a switching element that is opposite from the switching element 110 to turn on, or the like. However, in the semiconductor device 100 including the switching element 110 and the driving apparatus 140, the minimum time period and the maximum time period of the tc(on) can be set as specifications.

Between time t1 and t2 and after overshoot occurs, the collector current Ic is decreased to the value after turn-on. After that, the collector current Ic is gradually increased in the steady state accompanied with a gradual increase of current flowing through an inductance component of the load 120.

An ideal voltage waveform 200 is an ideal waveform of the sense voltage Vsc, which is in proportion to the collector current Ic even in the transient state during turn-on of the switching element 110. However, in the transient state during turn-on, the sense current flowing through the current sensing terminal of the switching element 110 largely overshoots exceeding the overshooting amount of the collector current Ic as a result of the current shunt ratio of the sense current relative to the collector current Ic fluctuating. Accordingly, as shown by the voltage waveform 210, if the sense current flowing through the current sensing terminal of the switching element 110 flows through the current detection resistance 130 as it is, the sense voltage Vsc can exceed the reference voltage Voc and excessively overshoot. As a result, the overcurrent determining circuit 180 erroneously detects overcurrent of the collector current Ic, and the driving circuit 145 cause malfunction to a protective function of forcing the switching element 110 to be in an off-state, or the like.

The overshoot processing circuit 160 according to the present embodiment controls the base of the transistor 150 depending on an input from the current sensing terminal of the switching element 110 so as to make at least a part of the sense current from the switching element 110 flow out to the reference potential 105 via the transistor 150, and reduces the sense current to flow through the current detection resistance 130 in the transient state at the time of turn-on of the switching element 110. Thereby, the overshoot processing circuit 160 reduces overshoot of the sense current to flow through the current detection resistance 130. Also, if the resistance 166 is provided, end-to-end voltage of the current detection resistance 130 is divided in the transient state by the resistance 166 and the transistor 150 and input to the overcurrent determining circuit 180. As a result, as shown by a voltage waveform 220, overshoot of the sense current Vsc input to the overcurrent determining circuit 180 is reduced, and the overcurrent determining circuit 180 can be prevented from erroneously detecting overcurrent of the collector current Ic. Because the overshoot processing circuit 160 puts the transistor 150 in the blocked state in a steady state after turn-on of the switching element 110, the overshoot processing circuit 160 can make substantially all the sense current from a current terminal of the switching element 110 flow in the current detection resistance 130 immediately after the transient state has elapsed, and appropriately detect sense current corresponding to the collector current Ic.

In turn-off operation of the switching element 110, if the input voltage Vin falls down, the gate control output signal GCout falls down after the delay caused by the driving circuit 145 or the like, then the voltage Vce in the collector-emitter junction of the switching element 110 starts to increase and becomes 10% of the rated value at time t3. Also, if the gate voltage of the switching element 110 is decreased to the threshold voltage or lower, the collector current Ic is rapidly decreased and becomes 10% of the rated value at time t4. The period of time from when the voltage Vce becomes 10% of the rated value at the time of turn-off of the switching element 110 to when the collector current Ic becomes equal to 10% or less of the rated value is defined as tc(off) (Vce-Ic Cross time of turn-off). Similar to the tc(on), the tc(off) can also change depending on the ability of the switching element 110 or the like. However, in the semiconductor device 100 including the switching element 110 and the driving apparatus 140, the minimum time period, the maximum time period, or the like of the tc(off) can be set as specifications.

Between time t3 to t4 and after overshoot occurs, the voltage Vce is decreased to the value after turn-on. After time t4, the collector current Ic becomes zero and the switching element 110 will be in a blocked state.

An ideal voltage waveform 230 is an ideal waveform of the sense voltage Vsc, which is in proportion to the collector current Ic even in the transient state during turn-off of the switching element 110. However, in the transient state during turn-off, the sense current flowing through the current sensing terminal of the switching element 110 largely overshoots as a result of the current shunt ratio of the sense current relative to the collector current Ic fluctuating. Accordingly, as shown by the voltage waveform 240, if the sense current flowing through the current sensing terminal of the switching element 110 flows through the current detection resistance 130 as it is, the sense voltage Vsc can exceed the reference voltage Voc and excessively overshoot. As a result, the overcurrent determining circuit 180 erroneously detects overcurrent of the collector current Ic, and the driving circuit 145 forces the switching element 110 to be in an off-state and/or causes malfunction to a protective function such as notifying overcurrent to the microcontroller or the like.

The overshoot processing circuit 160 according to the present embodiment controls the base of the transistor 150 depending on an input from the current sensing terminal of the switching element 110 so as to make at least a part of the sense current from the switching element 110 flow out to the reference potential 105 via the transistor 150, and reduces the sense current to flow through the current detection resistance 130 in the transient state at the time of turn-off of the switching element 110. Thereby, the overshoot processing circuit 160 reduces overshoot of the sense current to flow through the current detection resistance 130. Also, if the resistance 166 is provided, end-to-end voltage of the current detection resistance 130 is divided in the transient state by the resistance 166 and the transistor 150 and input to the overcurrent determining circuit 180. As a result, as shown by a voltage waveform 250, overshoot of the sense current Vsc input to the overcurrent determining circuit 180 is reduced, and the overcurrent determining circuit 180 can be prevented from erroneously detecting overcurrent of the collector current Ic.

Note that, the capacitance value C1 of the capacitor 162, and a resistance value R1 of the resistance 166, and a resistance value R2 of the resistance 164 within the overshoot processing circuit 160 may be set in accordance with a mode of the protection operation of the driving circuit 145. For example, if the protection operation of the switching element 110 is started upon the voltage waveform 220 and the ideal voltage waveform 230 exceeding the reference voltage Voc even once during the transient period of turn-on and turn-off, the capacitance value C1, the resistance value R1, and the resistance value R2 are set such that the voltage waveform 220 and ideal voltage waveform 230 do not exceed the reference voltage Voc in response to the switching element 110 turning on to a state in which full rated current flows through, or the switching element 110 turning off from a state in which full rated current flows through.

In another example, the overshoot processing circuit 160 may have a mode of the protection operation of the switching element 110, which is started if the period of time in which the voltage waveform 220 and the ideal voltage waveform 230 exceed the reference voltage Voc becomes equal to a reference time or longer during the transient period of turn-on and the turned off. In this case, the capacitance value C1, the resistance value R1, and the resistance value R2 are set such that the voltage waveform 220 and the ideal voltage waveform 230 do not exceed the reference voltage Voc by the reference time or longer in response to the switching element 110 turning on to a state in which full rated current flows through or the switching element 110 turning off from the state in which full rated current flows through.

Figure 3:
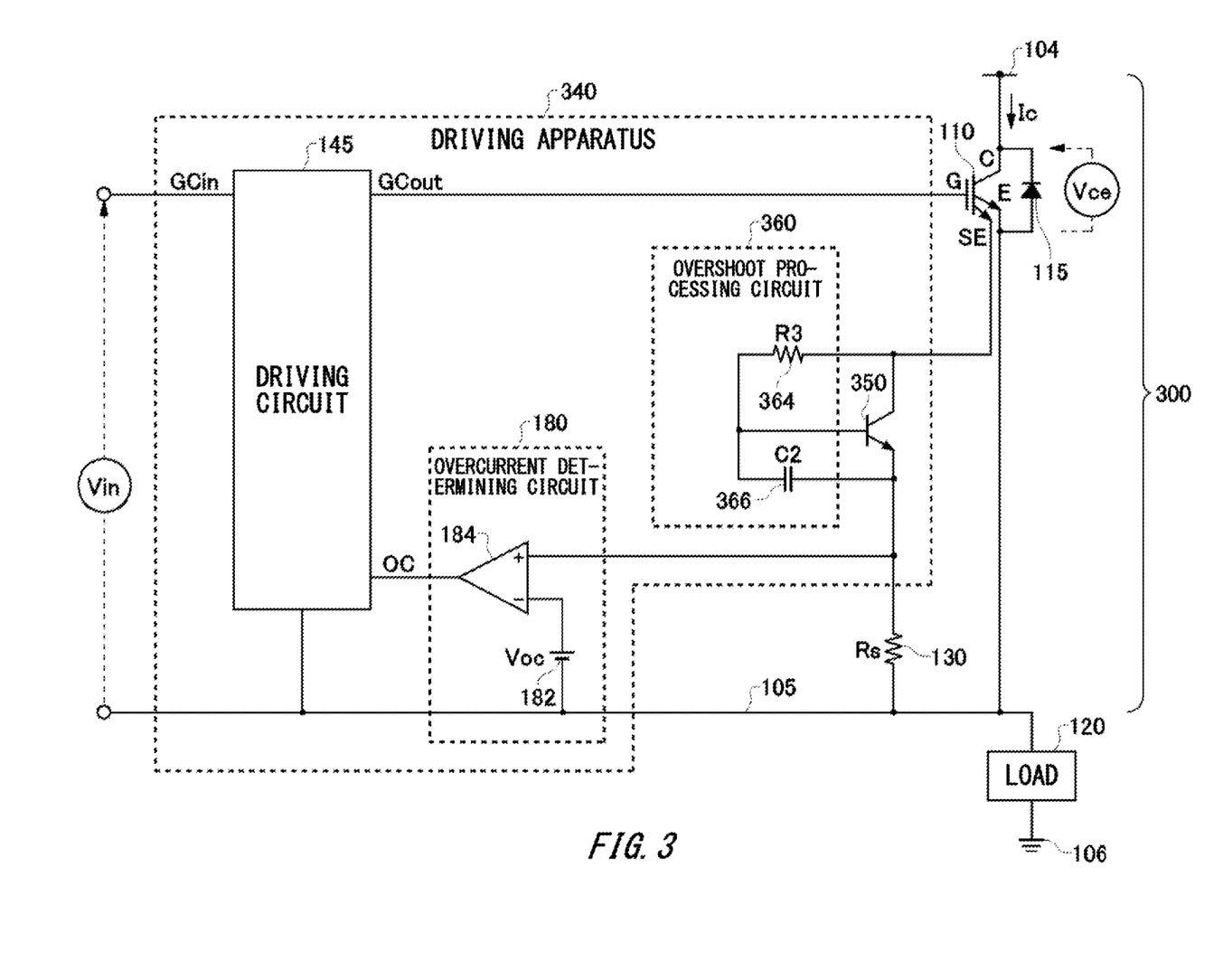
FIG. 3 illustrates a semiconductor device 300 according to a variant of the present embodiment together with a load 120.

FIG. 3 illustrates a semiconductor device 300 according to a variant of the present embodiment together with a load 120. The same reference symbols of members used in the present diagram and FIG. 1 indicate that the members have configurations similar to each other. Thereby, explanation thereof will be omitted except for parts different from each other.

The driving apparatus 340 drives the switching element 110 by supplying the gate of the switching element 110 with gate voltage that corresponds to a gate control input signal GCin externally input, and controls on/off of the switching element 110. Also, the driving apparatus 340 determines whether or not overcurrent is flowing through the switching element 110 based on the sense voltage generated by a current detection resistance 130. If overcurrent is flowing through the switching element 110, the driving apparatus 340 protects the switching element 110. The driving apparatus 340 may have its part of or the entire circuit integrated as an IC or a LSI.

In the present variant, the driving apparatus 340 has a transistor 350 in place of the transistor 150 in the driving apparatus 140 of FIG. 1, and has an overshoot processing circuit 360 in place of the overshoot processing circuit 160 in the driving apparatus 140 of FIG. 1. Also, the driving apparatus 340 is free of the integrator circuit 170 in the driving apparatus 140 of FIG. 1. Instead of this, the driving apparatus 340 may have a configuration in which it has the integrator circuit 170.

The transistor 350 has a collector-emitter junction connected in series to the current detection resistance 130. In the present variant, between a current sensing terminal and the current detection resistance 130, the transistor 350 has its collector and emitter directly or indirectly connected to a current sense device side and a current detection resistance 130 side respectively. Thereby, the collector-emitter junction of the transistor 350 is connected in series to the current detection resistance 130. The transistor 350 may be an NPN transistor having a collector directly or indirectly connected to the current sensing terminal of the switching element 110. The transistor 350 may be directly or indirectly connected to the switching element 110 side of the current detection resistance 130. Instead of this, the transistor 350 may be another type of transistor, a FET, or the like.

The overshoot processing circuit 360 is connected between a current sensing terminal of the switching element 110 and a base (or a gate) of the transistor 350. In the present variant, the overshoot processing circuit 360 is connected to the current sensing terminal of the switching element 110 (the collector of the transistor 350), the base of the transistor 350, and the emitter of the transistor 350. By controlling the transistor 350 depending on current input from the current sensing terminal, the overshoot processing circuit 360 reduces overshoot of sense current flowing through the current detection resistance 130, which is caused by switching operation of the switching element 110.

The overshoot processing circuit 360 according to the present variant has a resistance 364 connected between the collector and the base of the transistor 350, and a capacitor 366 connected between the base and the emitter of the transistor 350. The resistance 364 and the capacitor 366 are an example of the third resistor and the second capacitor respectively. They constitute an integrator circuit to integrate an input from the current sensing terminal of the switching element 110 and output the input to the base of the transistor 350. The overshoot processing circuit 360 controls the base of the transistor 350 such that sense current from the current sensing terminal flows through the current detection resistance 130 in a steady state in the on-state or off-state of the switching element 110. If sense current from the current sensing terminal is drastically increased in the steady state, the resistance 364 and the capacitor 366 act as delay elements to delay increase in base voltage of the transistor 350 so that the base voltage is raised moderately. As a result, the transistor 350 can suppress drastic increase in both sense current flowing through the current detection resistance 130 and sense voltage to occur at the current detection resistance 130.

Here, the overshoot processing circuit 360 may have the time constant corresponding to at least one of turn-on time and turn-off time of the switching element 110. That is, for example, in a circuit between the current sensing terminal of the switching element 110 and the base of the transistor 350, the overshoot processing circuit 360 may have the time constant that is determined depending on turn-on time and/or turn-off time of the switching element 110. As an example, the overshoot processing circuit 360 may have the time constant substantially equal to at least one of turn-on time and turn-off time of the switching element 110. Thereby, in a configuration in which the switching element 110 is applied to the semiconductor device 100, if the transient period in turn-on and/or turn-off of the switching element 110 is long, the time constant of the overshoot processing circuit 360 is made large accordingly. Also, if the transient period is short, the time constant of the overshoot processing circuit 360 is made small accordingly. As a result, the overshoot processing circuit 360 allows the period of time in reducing the overshoot to be a short period of time while appropriately reducing the overshoot of the sense current of the switching element 110 in the transient state.

According to the semiconductor device 300 described above, overshoot of the sense voltage to occur at the current detection resistance 130 can be reduced by controlling the base of the transistor 150 depending on the input from the current sensing terminal, and by limiting at least a part of sense current in a transient state during switching of the switching element 110 by using the transistor 350. It can be construed that this operation is about the transistor 350 and the overshoot processing circuit 360 clamping the sense current that flows through the current detection resistance 130 in a transient state.

In the present variant, the overshoot processing circuit 360 has a configuration of a RC integrator circuit having the resistance 364 and the capacitor 366. Instead of this, the overshoot processing circuit 360 may be any one of various filters including a delay element to delay an input from the current sensing terminal of the switching element 110 and then supply the input to the base of the transistor 350 in order to suppress rapid increase in sense current flowing through the transistor 350 that is connected in series to the current detection resistance 130.

Figure 4:
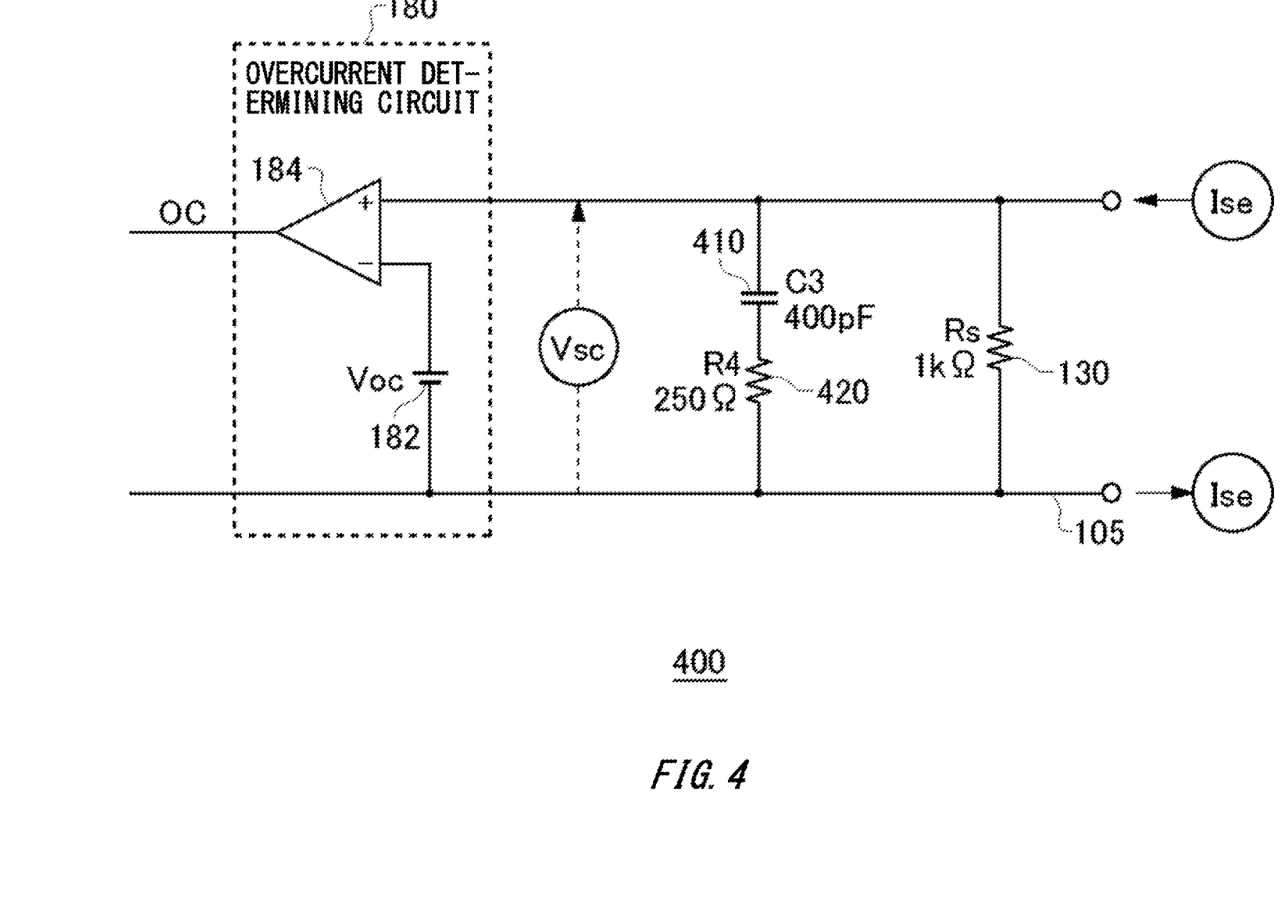
FIG. 4 illustrates a circuit 400 according to the first comparative example of the present embodiment.
Figure 5:
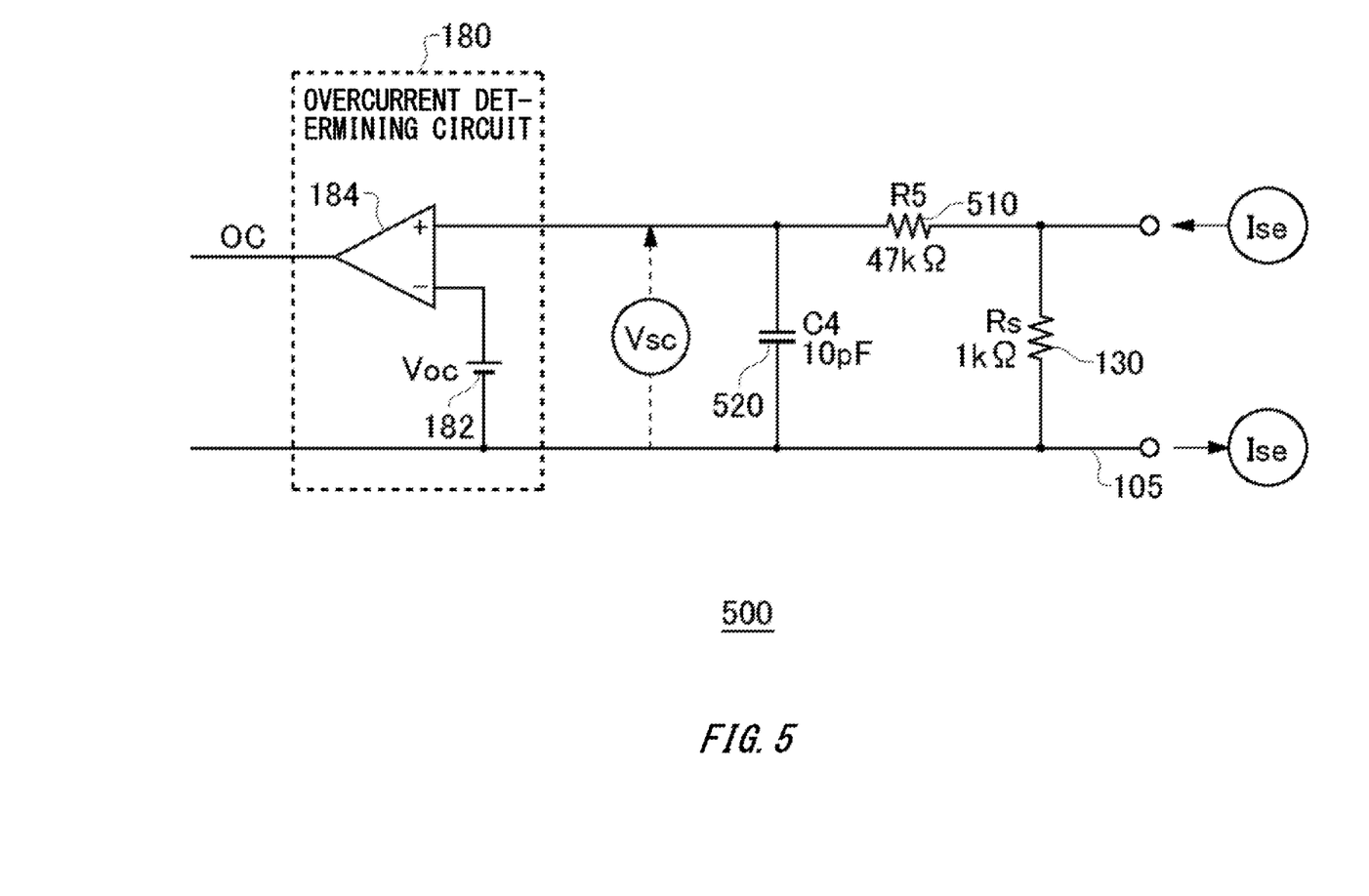
FIG. 5 illustrates a circuit 500 according to the second comparative example of the present embodiment.
Figure 6:
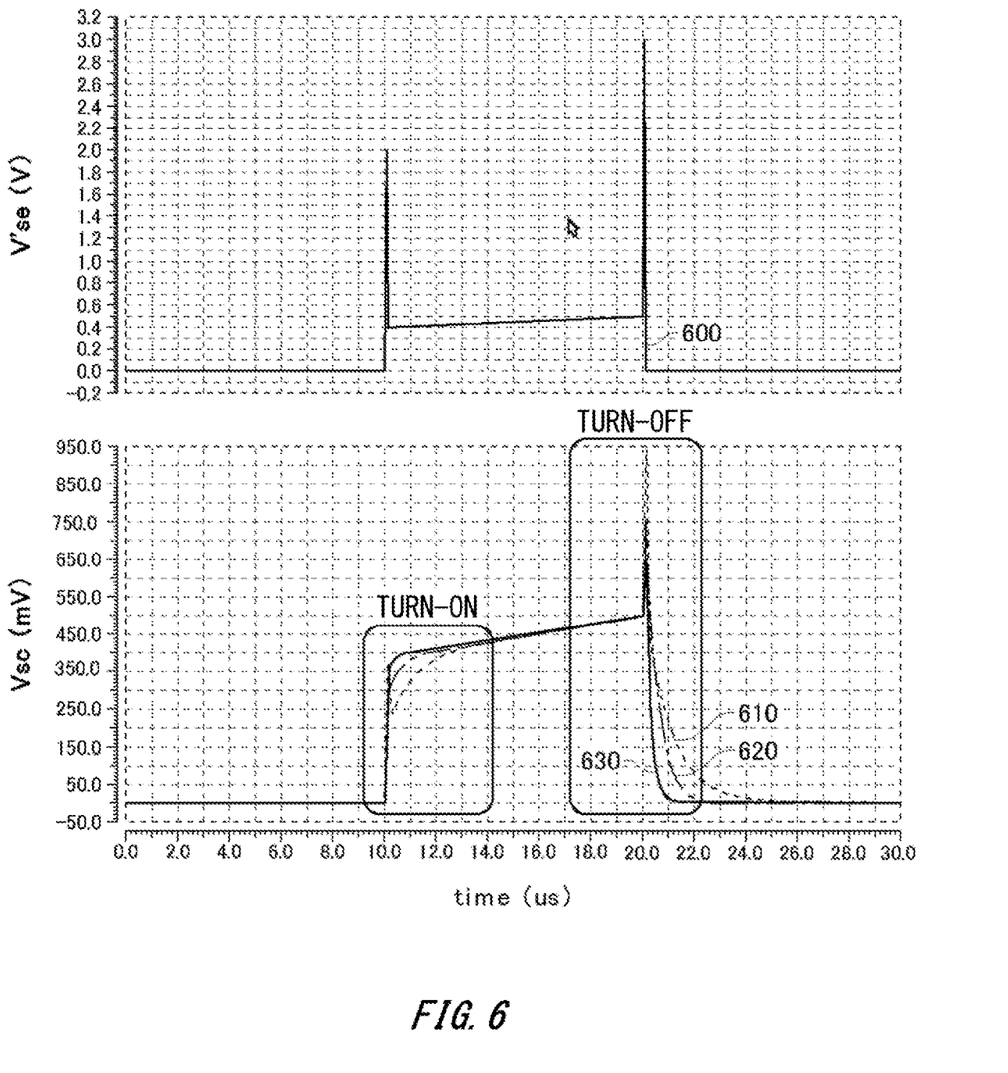
FIG. 6 illustrates simulation results of the example of the present embodiment and each comparative example.

FIG. 4 to FIG. 6 illustrate results of reducing effect of overshoot in the example of the present embodiment and the comparative example after simulation. The simulation is conducted using a circuit simulator. The target of the simulation in the example of the present embodiment is a part of the circuit including the current detection resistance 130, the transistor 150, the overshoot processing circuit 160, the integrator circuit 170, and the overcurrent determining circuit 180 of FIG. 1. It is defined that the resistance value Rs of the current detection resistance 130 is 1 kΩ, the capacitance value C1 of the capacitor 162 is 12 pF, the resistance value R2 of the resistance 164 is 70 kΩ, the resistance value R1 of the resistance 166 is 1 kΩ, the resistance value Ri of the resistance 172 is 10 kΩ, and the capacitance value Ci of the capacitor 174 is 10 pF. Note that, for the purpose of stabilizing the base of the transistor 150, a capacitor having a capacitance value of 1 pF is added between the base of the transistor 150 and the reference potential 105, in parallel to the resistance 164.

FIG. 4 illustrates a circuit 400 according to the first comparative example of the present embodiment. The circuit 400 has a configuration in which a capacitor 410 and a resistance 420 are provided being connected in series between a current sensing terminal and a reference potential 105 in place of the transistor 150 and the overshoot processing circuit 160. A capacitance value C3 of the capacitor 410 is 400 pF, and a resistance value R4 of the resistance 420 is 250Ω. Similar to the example, a resistance value of a current detection resistance 130 is defined as 1 kΩ.

FIG. 5 illustrates a circuit 500 according to the second comparative example of the present embodiment. The circuit 500 has a configuration of a RC integrator circuit in which a resistance 510 and a capacitor 520 is provided in place of the transistor 150 and the overshoot processing circuit 160. The resistance 510 is connected in series between a current sensing terminal and an overcurrent determining circuit 180, and the capacitor 520 is connected between a wire between the resistance 510 and an overcurrent determining circuit 180 and a reference potential 105. A resistance value R5 of the resistance 510 is 47 kΩ, and a capacitance value C4 of the capacitor 520 is 10 pF.

FIG. 6 illustrates simulation results of the example of the present embodiment and each comparative example. The present graph takes the time in the horizontal axis, and illustrates a voltage waveform 600 of the reference voltage source on top and waveforms of voltages Vsc corresponding to the comparative example 1, the comparative example 2, and the example on bottom. In the present simulation, the voltage waveform 600 of sense voltage of the current detection resistance 130 is generated in a case in which overshoot is not reduced by the reference voltage source. Then, waveforms of sense currents Ise being in proportion to the voltage waveform 600 are input to circuits of the comparative example 1, the comparative example 2, and the example to acquire voltage waveforms of the voltages Vsc supplied to the overcurrent determining circuits 180.

Upon turn-on, overshoot can be suppressed in any of a voltage waveform 630 of the present example, a voltage waveform 610 of the comparative example 1, and a voltage waveform 620 of the comparative example 2. Compared with the voltage waveform 610 of the comparative example 1 and the voltage waveform 620 of the comparative example 2, the voltage waveform 630 of the present example follows the original sense current waveform at faster timing after the transient period ends. Upon turn-off, the voltage waveform 630 of the present example has the voltage Vsc having the maximum value of approximately 650 mV. Thus, compared with the voltage waveform 610 of the comparative example 1 (approximately 940 mV) and the voltage waveform 620 of the comparative example 2 (approximately 790 mV), the voltage waveform 630 further reduces the overshoot.

In this way, as a result of following the original sense current waveform at faster timing at the time of turn-on, the driving apparatus 340 according to the present embodiment can put overcurrent in a detectable state in a short amount of time. At the time of turn-off, the driving apparatus 340 can further reduce overshoot.

Figure 7:
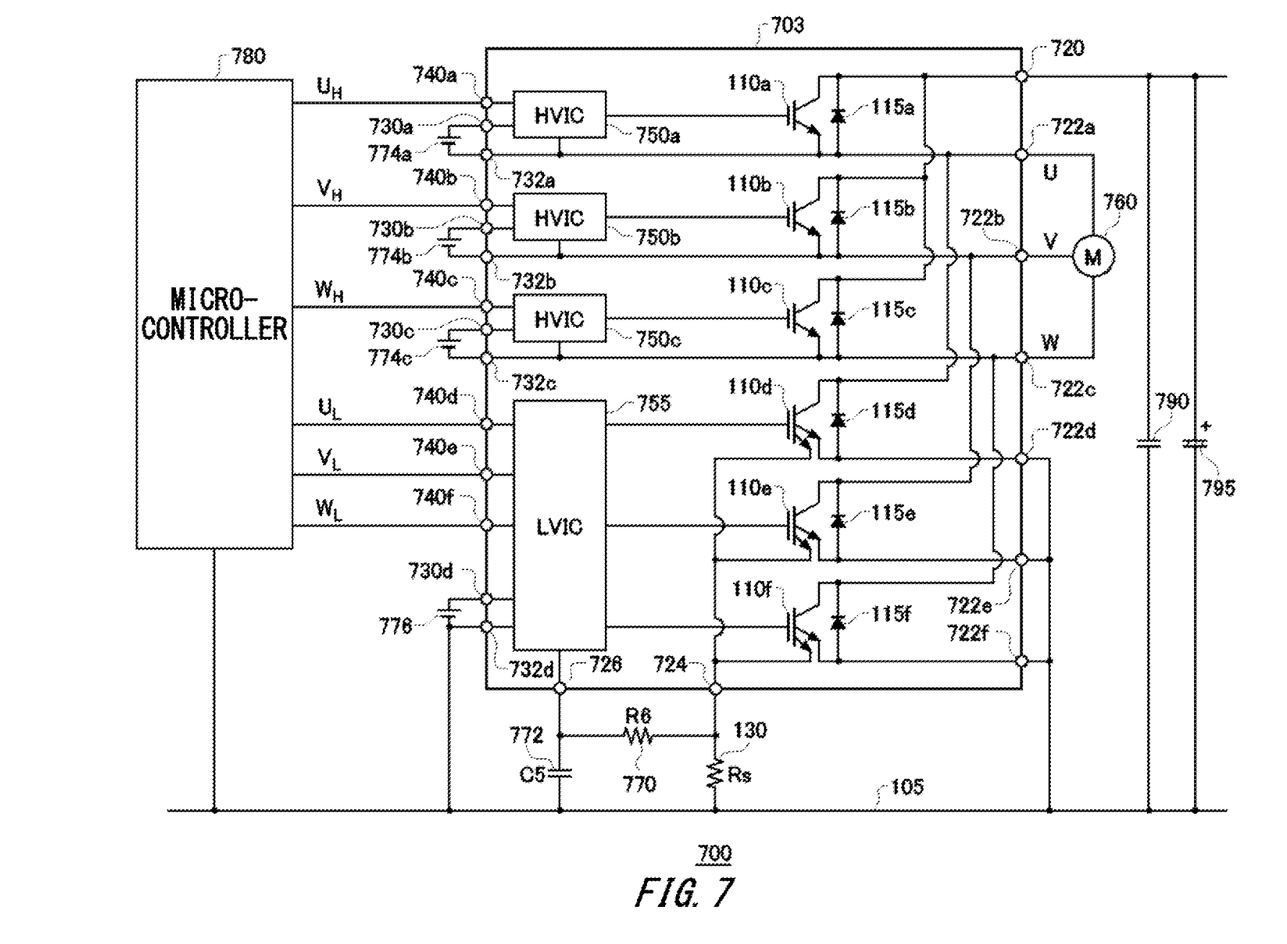
FIG. 7 illustrates a semiconductor device 700 according to a variant of the present embodiment.

FIG. 7 illustrates a semiconductor device 700 according to a variant of the present embodiment. The same reference symbols of members used in the present diagram and FIG. 1 indicate that the members have configurations similar to each other. Thereby, explanation thereof will be omitted except for parts different from each other.

A motor 760 is as an example of the load 120 and driven by the semiconductor device 700. The semiconductor device 700 includes a power module 703, a motor 760, a current detection resistance 130, a resistance 770, a capacitor 772, high side power supplies 774a to 774c, a low side power supply 776, a capacitor 790, and a capacitor 795.

The power module 703 has switching elements 110a to 110f, diodes 115a to 115f, HVICs 750a to 750c, and a LVIC 755. In the present embodiment, the power module 703 is an intelligent power module in which the switching elements 110a to 110f of a power MOSFET, an IGBT, or the like, and driving circuits and protecting circuits of the switching elements 110a to 110f are integrated.

The switching elements 110a to 110f correspond to the switching element 110 of FIG. 1. In the present variant, in order to drive each phase of a three-phase motor using a pair of switching elements 110 on an upper arm side and lower arm side, the power module 703 has six switching elements 110. The switching element 110a corresponds to the upper arm for a U-phase, and has a collector-emitter junction connected between a terminal 720 that is connected to a high side power supply and a terminal 722a that is connected to a U-phase terminal of the motor 760. The switching element 110*b* corresponds to the upper arm for a V-phase, and has a collector-emitter junction connected between the terminal 720 and a terminal 722*b* that is connected to a V-phase terminal of the motor 760. The switching element 110*c* corresponds to the upper arm for a W-phase, and has a collector-emitter junction connected between the terminal 720 and a terminal 722*c* connected to a W-phase terminal of the motor 760. The switching element 110*d* corresponds to the lower arm for the U-phase, and has a collector-emitter junction connected between the terminal 722*a* and a terminal 722*d* that is connected to a reference potential 105. The switching element 110*e* corresponds to the lower arm for the V-phase, and has a collector-emitter junction connected between the terminal 722*b* and a terminal 722*e* that is connected to the reference potential 105. The switching element 110*f* corresponds to the lower arm for the W-phase, and has a collector-emitter junction connected between the terminal 722*c* and a terminal 722*f* that is connected to the reference potential 105. In the present variant, the switching elements 110*a* to 110*c* corresponding to the upper arms are free of current sensing terminals. The switching elements 110*d* to 110*f* corresponding to the lower arms have current sensing terminals, and each current sensing terminal is connected to the same current detection resistance 130 via a terminal 724.

Cathode-to-anode junctions of the diodes 115*a* to 115*f* are connected to collector-emitter junctions of the switching elements 110*a* to 110*f* respectively.

The HVICs 750*a* to 750*c* are driving apparatuses to drive switching elements 110*a* to 110*c* of the upper arms of the U-phase, V-phase, and W-phase, respectively. In the present variant, since the HVICs 750*a* to 750*c* are driving ICs on the high voltage side, they are referred to as HVICs (High-Voltage ICs). Each HVIC 750 operates using a potential of the corresponding switching element 110 on the emitter side (a potential of a wire between each terminal 722 and each terminal 732) as a reference potential. Respective HVICs 750 drive the switching elements 110*a* to 110*c* by supplying gates of corresponding switching elements 110*a* to 110*c* with gate voltages corresponding to gate control input signals $U_H$, $V_H$, and $W_H$ from the microcontroller 780, and controls on/off of the switching elements 110*a* to 110*c*. In this way, because the HVICs 750*a* to 750*c* have reference potentials of operation different from each other, the HVICs 750*a* to 750*c* are driver ICs in phases independent of each other in the present variant. If an independent reference potential is provided in each phase within the IC, the HVICs 750*a* to 750*c* may be integrated into one IC. In the present variant, HVICs 750*a* to 750*c* may have a configuration free of overcurrent detecting functions, and free of the transistor 150, the overshoot processing circuit 160, the integrator circuit 170, and the overcurrent determining circuit 180 in the driving apparatus 140 of FIG. 1.

The LVIC 755 is a driving apparatus to drive switching elements 110*d* to 110*f* of the lower arms of the U-phase, V-phase, and W-phase. In the present variant, since the LVIC 755 is a driving IC on the low voltage side, it is referred to as a LVIC (Low-Voltage IC). The LVIC 755 operates using potentials of the switching elements 110*d* to 110*f* on the emitter side, that is, the reference potential 105, as a reference potential. The LVIC 755 drives the switching elements 110*d* to 110*f* by supplying gates of corresponding switching elements 110*d* to 110*f* with gate voltages corresponding to gate control input signals $U_L$, $V_L$, and $W_L$ from the microcontroller 780, and controls on/off of the switching elements 110*d* to 110*f*.

Also, the LVIC 755 inputs sense voltage generated by the current detection resistance 130 externally connected to the power module 703 via a terminal 726, and determines whether or not overcurrent is flowing through the switching elements 110 based on the sense voltage. If overcurrent is flowing through at least one of the switching elements 110*d* to 110*f*, the LVIC 755 protects the switching element 110 through which the overcurrent is flowing. In the present variant, because the LVIC 755 drives on the switching elements 110 at timing different in each phase, there is no timing in which two or more of the switching elements 110*d* to 110*f* are in on state simultaneously. Accordingly, the LVIC 755 can perform overcurrent detection of the switching elements 110*d* to 110*f* corresponding to the three-phases by using one current detection resistance 130. The LVIC 755 may have a configuration in which the driving apparatus 140 of FIG. 1 or the driving apparatus 340 of FIG. 3 is equipped corresponding to three-phases.

The motor 760 is a three-phase motor having three phases of a U-phase, a V-phase, and a W-phase. The motor 760 may be another motor having a different number of phases. The number of driving circuits of the power module 703 may correspond to the number of phases of the motor 760.

The current detection resistance 130 is connected between a terminal 724 and the reference potential 105. In the present variant, the current detection resistance 130 is externally connected to the power module 703 in order to make the current detection resistance 130 changeable depending on a circuit that is externally connected to the power module 703. Instead of this, the power module 703 may incorporate the current detection resistance 130.

The resistance 770 and the capacitor 772 are connected to an end of the current detection resistance 130 on the switching element 110 side, and constitute an integrator circuit to smoothen sense voltage from the current detection resistance 130 and supply the sense voltage to the LVIC 755 via the terminal 726. Instead of this, the semiconductor device 700 may have a configuration free of resistance 770 and capacitor 772, and sense voltage from the current detection resistance 130 is supplied directly to the LVIC 755.

Having the potentials of the terminals 732*a* to 732*c* as a reference, the high side power supplies 774*a* to 774*c* boost voltage to generate power supply voltages of the HVICs 750*a* to 750*c*, and supply the HVICs 750*a* to 750*c* with the power supply voltages via the terminals 730*a* to 730*c*. Having the reference potential 105 as a reference, the low side power supply 776 boosts voltage to generate a power supply voltage of the LVIC 755, and supply the LVIC 755 with the power supply voltage via the terminal 730*d*.

In order to rotate the motor 760 at a desired number of times, the microcontroller 780 generates the gate control input signals $U_H$, $V_H$, $W_H$, $U_L$, $V_L$, and $W_L$, and supplies the HVICs 750*a* to 750*c* and the LVIC 755 of the power module 703 with the gate control input signals via the terminals 740*a* to 740*f*. The microcontroller 780 may control each gate control input signal by PWM (pulse width modulation) control.

The capacitor 790 and the capacitor 795 are connected in parallel between a high side power supply and the reference potential 105, and stabilize the power supply voltage of the semiconductor device 700.

According to the semiconductor device 700 described above, overshoot of sense current to flow through the current detection resistance 130 and overshoot of sense voltage to occur at the current detection resistance 130, which are caused by switching of the switching elements 110*a* to 110*f*, can be reduced.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
    a transistor and an overshoot processing circuit, wherein
        the transistor has a collector connected to one end side of a current detection resistance that is connected to a current sensing terminal of a switching element, and an emitter connected to another end side of the current detection resistance,
        the overshoot processing circuit is connected between the current sensing terminal and a base of the transistor, and reduces overshoot of sense current flowing through the current detection resistance, which is caused by switching operation of the switching element, by controlling the transistor depending on current input from the current sensing terminal, and
        the current sensing terminal is configured to output the sense current, which changes corresponding to a main current flowing through a collector-emitter junction of the switching element.

2. The semiconductor device according to claim 1, wherein the overshoot processing circuit has
    a first capacitor connected between the current sensing terminal and the base of the transistor, and
    a first resistor connected between the current sensing terminal and the collector of the transistor.

3. The semiconductor device according to claim 2, wherein the overshoot processing circuit further has a second resistor connected between the base and the emitter of the transistor.

4. The semiconductor device according to claim 2, wherein the overshoot processing circuit has time constant corresponding to at least one of turn-on time and turn-off time of the switching element.

5. The semiconductor device according to claim 1, further comprising:
    an overcurrent determining circuit to determine overcurrent based on voltage occurring at the current detection resistance.

6. The semiconductor device according to claim 5, further comprising:
    an integrator circuit connected between the collector of the transistor and the overcurrent determining circuit.

7. The semiconductor device according to claim 6, wherein the integrator circuit has time constant smaller than that of the overshoot processing circuit.

8. The semiconductor device according to claim 5, further comprising:
    a driving circuit to drive the switching element.

9. A power module comprising:
    the semiconductor device according to claim 8, and the switching element.

10. The power module according to claim 9, further comprising:
    the current detection resistance.

* * * * *